(12) United States Patent
Gao et al.

(10) Patent No.: US 12,421,119 B2
(45) Date of Patent: Sep. 23, 2025

(54) ENHANCED GRAPHENE STRUCTURE BASED ON WEAK COUPLING, GRAPHENE FILM, AND PHOTOELECTRIC DEVICE

(71) Applicant: ZHEJIANG UNIVERSITY, Hangzhou (CN)

(72) Inventors: Chao Gao, Hangzhou (CN); Li Peng, Hangzhou (CN); Lingfei Li, Hangzhou (CN); Wenzhang Fang, Hangzhou (CN); Yingjun Liu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 814 days.

(21) Appl. No.: 17/696,899

(22) Filed: Mar. 17, 2022

(65) Prior Publication Data

US 2022/0204348 A1 Jun. 30, 2022

Related U.S. Application Data

(63) Continuation of application No. PCT/CN2020/141339, filed on Dec. 30, 2020.

(51) Int. Cl.
*C01B 32/186* (2017.01)
*H10F 30/227* (2025.01)
*H10F 77/122* (2025.01)

(52) U.S. Cl.
CPC ......... *C01B 32/186* (2017.08); *H10F 77/122* (2025.01); *C01B 2204/22* (2013.01);

(Continued)

(58) Field of Classification Search
CPC .............. C01B 32/186; C01B 2204/22; C01B 2204/04; C01B 2204/24; C01B 32/184; C01B 32/188; C01B 32/194; C01B 32/198; C01B 32/30; C01B 32/182; H10F 77/122; H10F 30/227; H10F 77/484; H10F 19/50; C01P 2002/01; C01P 2002/70; C01P 2002/82; H10H 29/855
See application file for complete search history.

(56) References Cited

U.S. PATENT DOCUMENTS

2014/0178688 A1* 6/2014 Tour ...................... C01B 32/186
156/60

OTHER PUBLICATIONS

Fitzer, et al., Recommended Terminology for the Description of Carbon As a Solid, Pure & Appl. Chem. 1995; 67(3): 473-508 (Year: 1995).*

(Continued)

*Primary Examiner* — Daniel C. McCracken

(57) ABSTRACT

A weakly coupled enhanced graphene film includes an enhanced graphene structure based on weak coupling, wherein the enhanced graphene structure based on weak coupling comprises a plurality of graphene units stacked vertically; the graphene unit is a single graphene sheet, or consists of two or more graphene sheets stacked in AB form; two vertically adjacent graphene units are weakly coupled, to promote the hot electron transition and increase the joint density of states, thereby increasing the number of hot electrons in high-energy states; the stacking direction of the graphene units in the graphene structure is in the thickness direction of the graphene film; and the graphene film enhances the accumulation of hot electrons in high-energy states by the enhanced graphene structure based on weak coupling.

10 Claims, 9 Drawing Sheets

(52) U.S. Cl.
CPC ...... *C01P 2002/01* (2013.01); *C01P 2002/70* (2013.01); *H10F 30/227* (2025.01)

(56) References Cited

OTHER PUBLICATIONS

An, et al., Characterizaiton of graphene nanoplatelets prepared from polyimide-derived graphite, Materials Letters 2015; 161: 321-324 (Year: 2015).*
Charlier, et al., First-principles study of the electronc proeprties of simple hexagonal graphite, Physical Review B 1992; 46(8): 4531-4539 (Year: 1992).*
Shi, et al., Electronic phase separation in multilayer rhomohedral graphite, Nature 2020; 584: 210-214 (Year: 2020).*

* cited by examiner

Separation of rGO and AAO membrane under excessive HI steam reduction

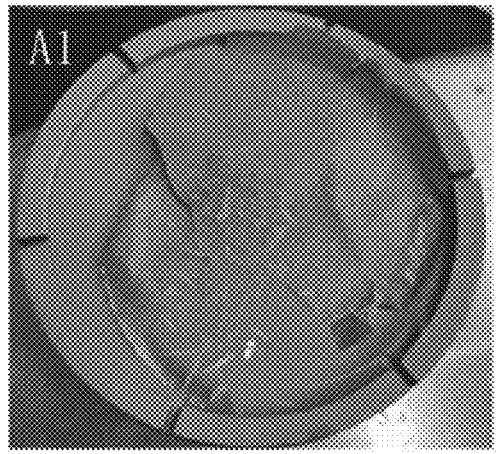
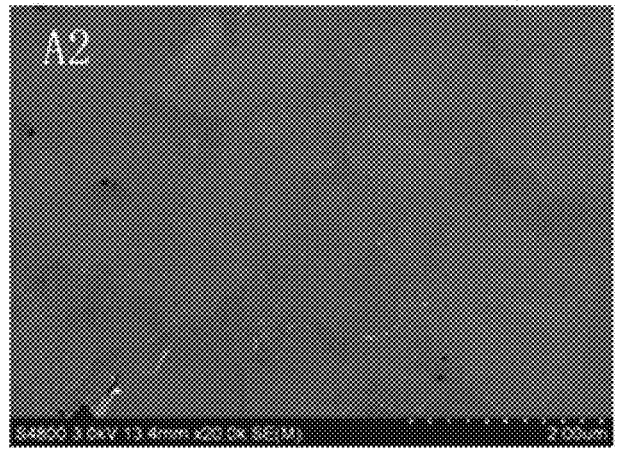
FIG. 10A1     FIG. 10A2
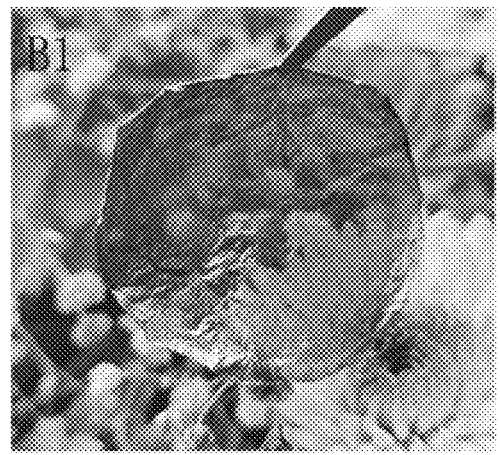
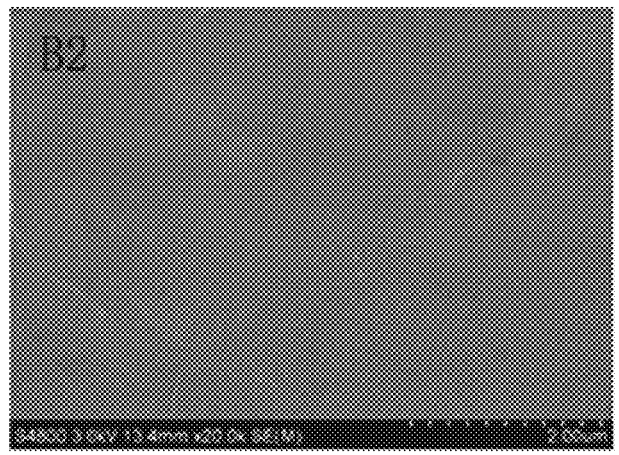
FIG. 10B1     FIG. 10B2

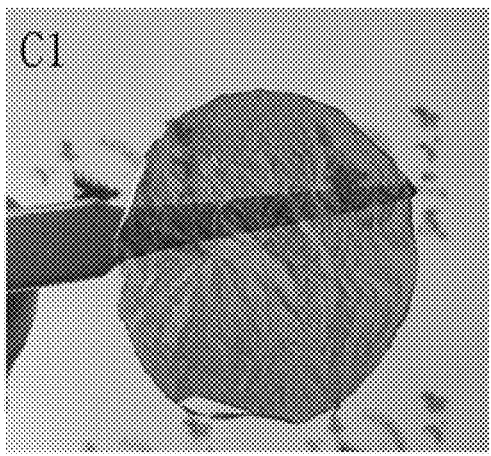
FIG. 10C1
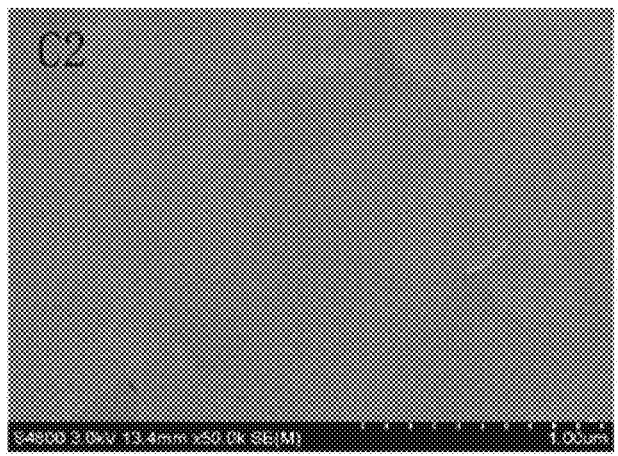
FIG. 10C2
FIG. 10D1
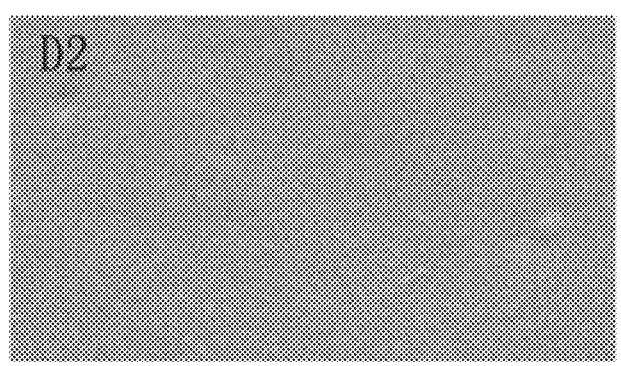
FIG. 10D2

ENHANCED GRAPHENE STRUCTURE BASED ON WEAK COUPLING, GRAPHENE FILM, AND PHOTOELECTRIC DEVICE

TECHNICAL FIELD

The present disclosure relates to a graphene functional material, and in particular to an enhanced graphene structure based on weak coupling, a graphene film, a device, and a preparation method thereof.

BACKGROUND

In 2010, two professors, Andre Geim and Konstantin Novoselov, from the University of Manchester in the United Kingdom, won the Nobel Prize in Physics for successfully separating stable graphene for the first time, which aroused the wide research of graphene all over the world. Graphene has excellent electrical properties (the electron mobility can reach $2 \times 2 \times 10^5$ cm$^2$/Vs at room temperature), outstanding performance (5000 W/mK), and extraordinary specific surface area (2630 m$^2$/g), Young's modulus (1100 GPa) and breaking strength (125 GPa). Graphene has excellent electrical and thermal conductivity completely superior to that of metals, and graphene also has the advantages of high-temperature and corrosion resistance, and good mechanical properties and low density that impart it the potential to replace metals in the field of electrothermal materials.

Graphene film macroscopically assembled with graphene oxide or graphene nanosheets is a main form of using nano-scale graphene, and the commonly used preparation methods include suction filtration, blade coating, spin coating, spray coating and dip coating. After further high-temperature treatment, the defects of graphene are repaired, and the electrical and thermal conductivity of the graphene film is effectively improved. As a result, the graphene film can be widely used in phonation, acoustic detection, photoelectric detection, smart phones, smart portable hardware, tablet computers, laptop computers and other portable electronic devices.

However, because single-sheet graphene has a very low light absorbance, it cannot absorb enough intensity of light, and has no response to electromagnetic waves in infrared, terahertz, and other lower energy bands. For this reason, great efforts are made by scientific researchers in the modification of graphene devices to improve the absorption of light by these devices. In addition, it is generally believed that single-sheet graphene cannot effectively accumulate hot electrons and overcome the barriers between graphene and semiconductors. Therefore, graphene has no obvious response in a low-energy band.

The traditional Schottky junction is a metal/semiconductor structure. However, the metal material itself has a very low light-excited hot electron lifetime (about 0.1 ps) and high noise, so it cannot be used in normal-temperature photoelectric devices. Compared with metal materials, the lifetime of hot electrons in single-sheet graphene is increased by about an order of magnitude (1 ps), and the noise at normal temperature is greatly suppressed. However, the excellent transparency of graphene makes it impossible to effectively accumulate hot electrons, so single-sheet graphene cannot overcome the barriers between graphene and semiconductors. Therefore, graphene has no obvious response in a low-energy band. In addition, the transfer of single-sheet graphene film is difficult, and the metal and polymer pollution cannot be completely removed. Graphene films (multi-sheet graphene film with stacked AB structure) capable of effective hot electron accumulation have been initially reported. However, their hot electron accumulation efficiency is very low, because the electronic structure in the graphene film of AB structure much resembles the graphite structure, having a low density of states and a weak high-energy-state orbital occupancy. Accordingly, the detection ability is relatively low.

In addition, the defect structure of graphene tends to increase the hot electron-phonon scattering in graphene. Therefore, in order to increase the relaxation time of hot electrons in graphene, high-temperature treatment is needed to repair the defect structure as much as possible, which increases the difficulty of preparing photoelectric detectors. However, the existence of the defect state increases the temperature of the device, which promotes the hot electron transition and improves the responsivity while the response speed is deteriorated.

SUMMARY

In an aspect of the present disclosure, the present disclosure provides an enhanced graphene structure based on weak coupling. This graphene structure increases the joint density of states and promotes light absorption by means of the weak coupling effect of a non-AB structure. Moreover, the introduction of a linear energy band of graphene of the non-AB structure promotes the hot electron transition, and increases the occupation probability of hot electrons in high-energy states.

In another aspect of the present disclosure, the present disclosure provides graphene nanofilms with weakly coupled stacked structure. This graphene film increases the joint density of states, enhances the light absorption, and promotes the hot electron transition by means of the weak coupling effect. This structure also reduces the requirements and costs of the film preparation process, and increases the success rate of film preparation.

In another aspect of the present disclosure, the present disclosure provides an enhanced graphene photoelectric device based on weak coupling, such as graphene/silicon Schottky junction. Since the graphene film has a zero band gap, it can absorb long-wavelength, low-energy light. Therefore, on the one hand, this improves the responsivity of the graphene/silicon photoelectric device; and on the other hand, the detection range extends from the visible and near infrared band to the mid-to-far infrared band, realizing the wide-spectrum detection. This idea is also applicable to other graphene/semiconductor Schottky photoelectric detectors (such as graphene/germanium detectors, etc.). The graphene film may also be introduced into other photoelectric detector system (such as photoconductive detectors, PIN detectors, and avalanche detectors), to enhance the absorption in the infrared band, so as to to achieve the wide-spectrum detection and infrared detection. Photoelectric detectors are currently widely used in many fields such as military industry, national defense, medical treatment, biology, and consumer electronics. For example, in the military, infrared photoelectric detectors are needed for reconnaissance and remote sensing; high-precision photoelectric detectors are also needed in various spectrometers for medical detection and material analysis to collect and retrieve the absorption, transmission, and emission spectra; and in the field of smart home that is currently under development, wireless infrared detectors also play an important role in the accomplishment of device connection and interaction. In the LIDAR, a core technology in the current popular unmanned driving area, a high-speed and high-sensitivity photodetector is also one of its core components. As for consumer electronics, since the photoelectric detector based on this graphene film enables wide-spectrum detection during the imaging process, it is expected to combine the multi-spectral fusion technology to fuse the visible image and the infrared image, thus achieving the increase of the details and the improvement of the sharpness of the image. In the medical field, photoelectric detection also find wide use. For example, blood oxygen detection is to retrieve the reflection of infrared light by hemoglobin through an infrared detector on a wearable device, and miniature photoelectric detectors will also play an important role in wearable and even implantable biosensors in the future.

An object of the present disclosure is to provide an enhanced graphene structure based on weak coupling, which includes a plurality of graphene units stacked vertically. The graphene unit is a single graphene sheet, or consists of two or more graphene sheets stacked in AB form; and two vertically adjacent graphene units are non-AB stacked structural regions, so that the two graphene units are weakly coupled. In the AB stacked region, the electron cloud merges into one, and the electronic structure in the graphene film much resembles the graphite structure. With this structure, the electron-phonon scattering in graphene is weakened and the relaxation time of hot electrons is prolonged. In the non-AB stacked structural region, the electron cloud is separated layer-by-layer, and the electronic structure in the graphene film much resembles the graphene structure, so that the joint density of states increases, the light absorption increases, and the hot electron transition becomes easier.

Another object of the present disclosure is to provide an enhanced graphene structure based on weak coupling, which includes a plurality of graphene units stacked vertically. The graphene unit is a single graphene sheet, or consists of 2 or 9 graphene sheets stacked in AB form; and two vertically adjacent graphene units are weakly coupled, resulting in high joint density of states and increased light absorption. The lap gap (in the vertical direction) caused by the structural unit consisting of no more than 9 graphene sheets can be controlled to about 3 nm, and hot electrons with a higher joint density of states can tunnel without being affected.

Another object of the present disclosure is to provide an enhanced graphene structure based on weak coupling, which includes a plurality of graphene units stacked vertically. The graphene unit is a single graphene sheet, and two vertically adjacent graphene units are weakly coupled The electronic structure of single-sheet graphene can effectively increase the joint density of states, promote the light absorption, promote the hot electron transition, and increase the occupation probability of hot electrons in high-energy states.

In another aspect of the present disclosure, the present disclosure provides a weakly coupled enhanced graphene photoelectric film, which realizes the superposition of light absorption by multiple graphene sheets and improves the light absorption rate and the hot electron lifetime of the graphene film through weak coupling, so that hot electrons can still accumulate in a low energy band.

Another object of the present disclosure is to provide a weakly coupled enhanced graphene photoelectric film, which includes a graphene structure. The graphene structure includes a plurality of graphene units stacked vertically. The graphene unit is a single graphene sheet, or consists of two or more graphene sheets stacked in AB form, and two vertically adjacent graphene units are weakly coupled. The stacking direction of the graphene units in the graphene structure is in the thickness direction of the graphene film. When light is irradiated on the surface of the graphene film, photoelectrons travel from the surface and through the AB stacked region and the non-AB stacked region. In the AB stacked region, the electron cloud merges into one, and the electronic structure in the graphene film much resembles the graphite structure, the hot electron-phonon scattering is weakened and the relaxation time of hot electrons is increased. In the non-AB stacked structural region, the electron cloud is separated layer-by-layer, and the electronic structure in the graphene film much resembles the graphene structure, the joint density of states increases, and the light absorption increases, promoting the hot electron transition.

The present disclosure also provides a weakly coupled enhanced graphene photoelectric film, which includes a graphene structure as described above. The stacking direction of the graphene units in the graphene structure is in the thickness direction of the graphene film. The non-AB structure content in the entire film is 5% or more, and even 90% or more. The large non-AB structure content causes the graphene film to have a large weakly coupled region and makes the overall electronic structure of the graphene film much resembles the single-sheet graphene, which greatly increases the joint density of states, enhances the light absorption and promotes the hot electron transition, thus further increasing the number of hot electrons in high-energy states.

In some embodiments, the graphene film has an $I_D/I_G$ ratio of 0.05 or less. Under normal circumstances, defects in graphene will increase the scattering by graphene, thereby reducing the relaxation time of hot electrons in graphene. However, the scattering of phonons by graphene defects is more concentrated in the horizontal direction, and the scattering in the vertical direction is less affected. The scattering of hot electrons by uncoupled stacked graphene units is mainly concentrated in the vertical direction, so the impact on the hot electron scattering is great, and critical. In short, the existence of weak coupling enhances the tolerance of the photoelectric effect of the graphene film to defects.

In some embodiments, a graphene oxide film obtained by solution assembly (by suction filtration, spin coating, or film dispensing) is thermally treated (graphitization furnace annealing, laser annealing, and microwave annealing, etc.) to repair the defects, so as to obtain the weakly coupled enhanced graphene film.

Since the substrate is not suitable for high-temperature heat treatment, in general, the graphene oxide film needs to be peeled off from the substrate before the thermal treatment. The present inventors found after numerous graphene peeling experiments that because the concentration of hydroiodic acid vapor is not enough and the relative vapor pressure is small during the reduction process, the HI vapor fails to penetrate into the contact interface between the graphene film and the substrate; and steam is entrained in the HI vapor, which provides an infiltration effect, and can hinder the rapid penetration of HI on the one hand and infiltrate the interface and inhibit the interface separation on the other hand. The asymmetric reduction and penetration of hydroiodic acid greatly reduce the contact area and force at the interface. This weak contact interface can be peeled off with the aid of solvents such as isopropanol. However, the infiltration of steam and the insufficient HI vapor pressure lead to the fact that the film cannot be separated from the substrate. In the present application, a method for peeling off a graphene film from a rigid porous substrate is proposed. By adjusting HI and controlling the vapor pressure of water, the asymmetric reduction and the interfacial permeation of HI are enhanced, to allow the graphene film to be gradually separated from the substrate. (FIG. 8). Specifically, the graphene oxide film having a thickness of 20-120 nm is deposited on a rigid substrate with a porosity of 60% or greater by solution assembly, and then peeled off from the rigid substrate through a process as follows. The graphene oxide film is placed in a reduction chamber with HI vapor and chemically reduced until the graphene oxide film is automatically peeled off from the substrate. The reduction is continued for 10 min or more in an environment where the HI concentration is at least 0.3 g/L or more and the steam concentration is 0.07 g/L or less.

In the present application, HI vapor with low steam content can be directly fed, or an evaporation chamber connected to the reduction chamber can be used to evaporate hydroiodic acid to feed HI vapor into the reduction chamber.

In some embodiments, the reduction chamber and the evaporation chamber are located in a same closed cavity, and the evaporation chamber is located below the reduction chamber. The evaporation chamber is located in an oil bath or a water bath at a temperature of 80-120° C. The reduction chamber has a condensation zone at the top, and the temperature in the condensation zone is controlled at 0-40° C. (usually at room temperature). The hydroiodic acid solution is evaporated into HI vapor and steam. The steam is condensed at the top, reducing the steam content in the cavity. Whereas, the condensation temperature of HI is low, and it remains gaseous. More preferably, a water absorbing material is provided in the condensation zone to absorb steam and condensed water, so as to prevent the condensed water from re-evaporation after falling down. As a common technical means used in the art, the water-absorbing material includes porous and strong water-absorbing materials such as water-absorbing filter paper and super absorbent resin, and strong water-absorbing chemicals such as calcium chloride and phosphorus pentoxide.

For the convenience of preparation, a HI-resistant rack is provided in the reduction chamber for loading the substrate, such as a polytetrafluoroethylene net rack, a hollow glass rack, and the like.

In some embodiments, the reduction chamber and the evaporation chamber are respectively located in two closed cavities. The two closed cavities are connected by a condenser tube; and the condenser tube condenses the steam evaporated in the evaporation chamber and returns it to the evaporation chamber. The hydroiodic acid solution is evaporated into HI vapor and steam. The steam is condensed in the condenser tube and returned to the evaporation chamber. Whereas, the condensation temperature of HI is relatively low, and it remains gaseous. As common knowledge in the art, the content of steam entering the reduction chamber can be effectively controlled. by setting parameters such as the length, inclination, and condensing environment of the condenser tube.

Preferably, the evaporation chamber and the reduction chamber are both located in an oil bath or a water bath at a temperature of 80-120° C. In some preferred solutions, the temperature of the reduction chamber is lower than that of the evaporation chamber, which is beneficial to the rapid diffusion of HI vapor to the reduction chamber. Moreover, after the HI is completely evaporated, the existence of the temperature difference will cause a pressure difference at both sides, whereby HI of a higher mass density is distributed in the reduction chamber in a low-temperature zone.

In the present application, the substrate is anodic aluminum oxide, a tetrafluoroethylene filter membrane, or a glass fiber filter membrane, etc.

The gas phase separation method is much mild and hardly has any strong tearing effect on the film compared with the solid phase transfer method that is just the opposite. Specifically, AAO is a fragile material. During the operation with a solid phase transfer agent, a weight burden is exerted on the AAO, which damages the AAO film or causes an incomplete coverage continuity, resulting in discontinuity in the peeling of the solid phase transfer agent. Finally, it is impossible to get a complete graphene nano-film (FIG. 9). In contrast, the gas-phase reduction method does not have these problems, and a perfect large-size graphene film can be obtained. With respect to the microstructure, strong adhesion between graphene oxide and the AAO substrate may be caused in the solid phase transfer method due to insufficient reduction of graphene, and hole-type tears are caused in local areas by contraction with cold (FIGS. 10A1 and A2)). However, the mild gas phase transfer method does not have this problem, and a perfect graphene film without any tears can be obtained (FIGS. 10B to D). In general, the solid phase transfer method requires careful operation by the laboratory personnel. In case of improper operation or inattention, the graphene nano-film tends to be damaged. Particularly, when the transfer agent is cold-grabbed, local hole damage may occur, as shown in FIGS. 10A1 and A2. In addition, the graphene still partially adheres to the substrate. Macroscopically, due to uneven temperature or transfer agent deposition, the local stress distribution is uneven, and the contraction and grabbing of the solid phase transfer agent is uneven, so a complete large-size graphene film cannot be obtained (10A1). Microscopically, due to some extremely small adhesions or uneven reduction, this part of graphene cannot be effectively peeled off during the grasping process, and thus tiny holes are formed, resulting in non-uniform materials and affecting the performance stability during use.

In some embodiments, the weakly coupled enhanced graphene film is obtained by forming a dense structure by stacking, layer by layer, the graphene films grown by CVD, and thermally treating (graphitization furnace annealing, laser annealing, and microwave annealing, etc.).

In some embodiments, the weakly coupled enhanced graphene film is obtained by solution assembly of a graphitizable material and thermal treatment (graphitization furnace annealing, laser annealing, and microwave annealing, etc.) to graphitize it. The graphitizable material includes polyimide.

In some embodiments, the weakly coupled enhanced graphene film is obtained from glass-transition small molecules (glucose, menthol, naphthalene, and anthracene, etc.) under the catalysis of a nickel-based catalyst.

In some embodiments, a mixture of graphene oxide with a non-graphitizable or low-graphitizable polymer (such as pitch, lignin, a structure having multiple phenyl rings such as polymerized and natural polycyclic aromatic hydrocarbons, and a linear conjugated structure system such as polyacrylonitrile, where the weight ratio is less than 1:6 (under normal circumstances, the carbon yield of graphene oxide is 66%, and the carbon yield of the polymer after graphitization is below 50%) and the maximum mixing ratio decreases with the increase of the phenyl ring structure) is assembled by solution and graphitized by heat treatment (for example, graphitization furnace annealing, laser heating annealing, microwave heating annealing, etc.) to obtain the weakly coupled enhanced graphene film. The mixture is characterized in that graphene can be used as a template to induce the low-graphitizable or non-graphitizable polymer to be graphitized in an ordered pattern along the graphene plane; meanwhile, the functional groups on the surface of graphene oxide can provides oxygen atoms for the polymer such as polyimide and polyacrylonitrile that needs to be pre-oxidized, thereby avoiding the occurrence of a core-shell structure in the pre-oxidation process of the material, ensuring the uniform pre-oxidation of the material, and ensuring the uniformity in the material structure during the high temperature process. This method avoids the requirement for high orientation in the process of graphitization of the polymer, and reduces the process conditions for graphitization of the polymer. Graphene can effectively catalyzes the graphitization of 4 atomic layers including two upper and two lower layers; and when more than four layers are present, more defects occur after the high-temperature catalysis. As the matching of the conjugate structure of the polymer decreases, the catalytic effect will also decrease.

The present disclosure also provides a graphene-based photoelectric device, which comprises a weakly coupled enhanced graphene film and a semiconductor substrate, wherein the graphene film realizes the superposition of light absorption and improves the light absorption rate of the graphene film through weak coupling, so that hot electrons can still accumulate in a low energy band. This allows hot electrons in high-energy states to overcome the graphene/semiconductor barrier, and finally a collectable electrical signal is obtained.

The present disclosure also provides a graphene-based photoelectric device, which comprises a weakly coupled enhanced graphene film and a semiconductor substrate, where the graphene film has a weakly coupled enhanced structure. The weakly coupled enhanced graphene structure includes a plurality of graphene units stacked vertically. The graphene unit is a single graphene sheet, or consists of two or more graphene sheets stacked in AB form, and two vertically adjacent graphene units are weakly coupled. The stacking direction of the graphene units in the graphene structure is in the thickness direction of the graphene film. Photoelectrons transit from the surface and through the AB stacked region and the non-AB stacked region to the semiconductor layer. In the AB stacked region, the electron cloud merges into one, and the electronic structure in the graphene film much resembles the graphite structure where the relaxation time of hot electrons in graphene is increased. In the non-AB stacked structural region, the electron cloud is separated layer-by-layer, and the electronic structure in the graphene film much resembles the graphene structure, where the joint density of states increases, and the light absorption in the infrared region increases, thus promoting the hot electron transition and allowing more hot electrons in higher-energy states to transit from graphene to the semiconductor.

The graphene film is spread on the semiconductor substrate by placing the graphene film on the semiconductor substrate, and dripping a solvent of high surface tension on the edge of the graphene film, so that the solvent spreads out the wrinkles of the graphene film when the solvent penetrates from the edge of the graphene film to the inside; and volatilizing the solvent.

In the present disclosure, the solvent of high surface tension includes deionized water, dmf, dmac, ethylene glycol, propylene glycol, o-xylene, toluene, butyl acetate, and a mixture thereof.

Preferably, after thee solvent is volatilized, the graphene film is further sintered at a sintering temperature of 400-1000 degrees Celsius to form the graphene-semiconductor interface and further reduce the dark current.

In the present disclosure, the semiconductor substrate comprises an elemental semiconductor or a compound semiconductor, including, but not limited to, one or more of Si, Ge, C, Sn, GaAs, InP, AlGaAs, InGaP, InGaAs, AlInGaP, AlInGaAs, InGaAsP, AlInGaAsP, GaN, InGaN, AlGaN, AlInGaN, GaP, alloys or derivatives thereof.

Another object of the present disclosure is to provide a method for preparing a graphene-based photoelectric device, which includes the following steps.

(1) reserving a working window on a semiconductor substrate, coating an insulating layer in other areas than the working window, and then sputtering an electrode layer in the insulating layer;

(2) spreading multiple layers of graphene films on the working window and in contact with the electrode layer, dripping an organic solvent to the edge of the graphene film to allow the organic solvent to penetrate from the edge of the graphene film to the inside, volatilizing the solvent, and tightly binding the film to the semiconductor by virtue of the surface tension of the solvent, to obtain an independent photoelectric device; and (3) encapsulating the photoelectric device, and connecting a lead wire respectively to the electrode layer and the semiconductor substrate of the photoelectric device for outputting detection signals.

The present disclosure also provides a method for increasing the hot electron transition probability of hot electrons in a vertical transmission direction of a graphene film. The method at least includes: increasing the number of non-AB structures in the vertical transmission direction of the graphene film, and promoting the hot electron transition by means of the weak coupling effect of the non-AB structures.

The present disclosure also provides a method for enhancing the accumulation of hot electrons in a vertical transmission direction of a graphene film. The method at least includes: increasing the number of non-AB structures in the vertical transmission direction of the graphene film, and increasing the hot electron transition probability by means of the weak coupling effect of the non-AB structures. In the method, the vertical AB stacked structure of graphene is adjusted to extend the relaxation time of hot electrons and promote the generation and accumulation of hot electrons in high-energy states.

Further, the method also includes: increasing the thickness of the film within the range of thickness≤60 nm. As the thickness and number of layers increase, the light absorption and the relaxation time of hot electrons increase, more hot electrons are generated, the hot electron transition probability is further increased by means of the weak coupling effect of the non-AB structures, and the joint density of states of graphene is also increased to promote the generation and accumulation of hot electrons in high-energy states. When the thickness is greater than 60 nm, an excessively high thickness will also increase the recombination of hot electrons and reduce the number of hot electrons that transit over the barrier.

BRIEF DESCRIPTION OF THE DRAWINGS

FIG. 10A1 shows a separated graphene oxide film (4 inches), in which a graphene nanofilm transferred with the aid of a solid phase transfer agent is shown.

FIG. 10A2 is an enlarged view of FIG. 10A1.

FIG. 10B1 shows a separated graphene oxide film (4 inches), in which a graphene nanofilm without damages prepared by the transfer agent-free method of the present application according to Examples 2 is shown.

FIG. 10B2 is an enlarged view of FIG. 10B1.

FIG. 10C1 shows a separated graphene oxide film (4 inches), in which a graphene nanofilm without damages prepared by the transfer agent-free method of the present application according to Examples 3 is shown.

FIG. 10C2 is an enlarged view of FIG. 10C1.

FIG. 10D1 shows a separated graphene oxide film (4 inches), in which a graphene nanofilm without damages prepared by the transfer agent-free method of the present application according to Examples 4 is shown.

FIG. 10D2 is an enlarged view of FIG. 10D1.

DESCRIPTION OF THE EMBODIMENTS

Figure 1:
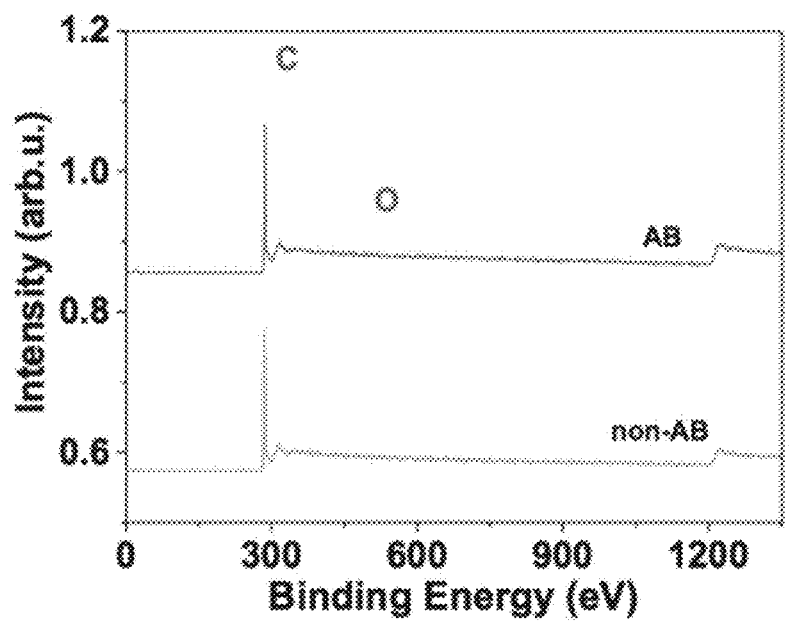
FIG. 1 is an xps spectrum of two graphene films prepared in Example 1.

The following description is intended to disclose the present disclosure so that those skilled in the art can accomplish the present disclosure. The preferred embodiments in the following description are only exemplary, and other obvious variations easily occur to those skilled in the art. The basic principles of the present disclosure defined in the following description are applicable to other embodiments, variations, improvements, equivalents, and other technical solutions without departing from the spirit and scope of the present disclosure.

In the following examples, the $I_D/I_G$ is tested as follows. A film is transferred to a silicon substrate, and tested over a full-wave band by Raman spectroscopy using 532-nm laser as a light source at a full power. A Raman spectrum containing a D peak, a G peak and a 2D peak is obtained. The areas of the D peak and the G peak are respectively defined as the intensity $I_D$ and $I_G$ of the D peak and the G peak, and $I_D/I_G$ is obtained by a division operation.

In the following examples, the test method of the AB structure content is as described in: Measuring the degree of stacking order in graphite by Raman spectroscopy, Carbon, 2008, 46(2), 272-275.

Single-layer graphene or multi-layer AB-stacked graphene exhibits a set of diffraction patterns consisting of 6 diffraction spots (evenly distributed on the same circumference). Moreover, as the number of AB-stacked graphene layer increases, the brightness of the spots increases. The existence of non-AB structure causes the occurrence of multiple sets of non-overlapping spots in the diffraction pattern. Based on this, in the following examples, the prepared film is placed under a high-resolution TEM to collect the electron diffraction pattern, and the vertically stacked structure can be tested according to the diffraction pattern. On the one hand, the number of structural units in the film can be calculated by the sets of diffraction spots; on the other hand, the stacked layers of each structural unit can be estimated by the ratio of the brightness of the diffraction spots to the diffraction brightness of a single layer of graphene.

The weak coupling effect described in the present disclosure refers to the coupling effect of electron cloud caused by the disordered stacking of graphene sheets. In this case, the electron cloud between the sheets does not achieve a complete coupling effect, and the intersheet spacing is 0.334-0.36 nm. For the AB-stacked structure, the orbit coupling strength of electron cloud between the graphene sheets is the largest, and the intersheet spacing is 0.334 nm; and this is a strong coupling effect.

In the present disclosure, the graphene unit is a single graphene sheet, or consists of 2-9 stacked graphene sheets. The number of graphene units in the vertical direction in the graphene film can be obtained by measuring the total thickness of the graphene film and dividing the thickness by the thickness of single-layer graphene. Moreover, the number of graphene sheets in a single graphene unit can be calculated by determining the AB structure content by Raman spectroscopy and averaging.

Example 1: Calculation of Enhancement by Weak Coupling

In this example, thin films with the same thickness were prepared, and the influence of the structure transformation of graphene films on the relaxation time of hot electrons and photoelectric detection were determined under the premise that the defects were ≈0. The preparation method was as follows:

Graphene film of non-AB structure: The graphene oxide was spin-coated to prepare a 24 nm-thick film, and heated to 2000° C. for 16 hrs at a ramping rate of 10° C. per minute. The content of non-AB structure is ≈100%, the number of graphene structural units in the vertical direction is 30, and the number of graphene sheet in a single graphene structural unit is 1.

Graphene film of AB structure: The graphene oxide was spin-coated to prepare a 24 nm-thick film, and heated to 2800° C. for 2 hrs at a ramping rate of 10° C. per minute.

Figure 2:
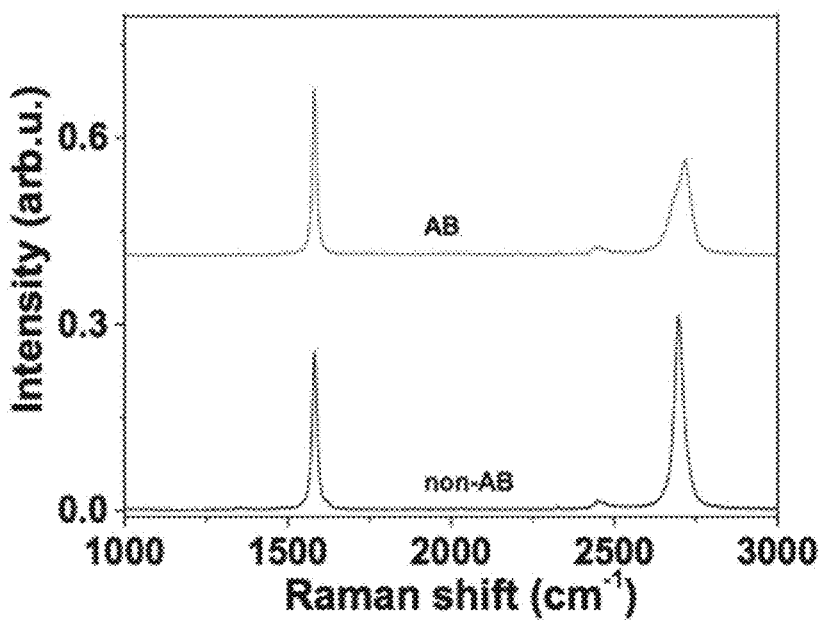
FIG. 2 is a Raman spectrum of two graphene films prepared in Example 1.

As shown in FIG. 1, after high-temperature sintering, the oxygen atoms in the two materials are completely removed, and no signal peaks of O are detected in the XPS spectrum. On this basis, the sp3 structure content and stacking form of the film were characterized by Raman spectroscopy in the present application. As shown in FIG. 2, no D peaks are observed for the two films, indicating that no sp3 structures exist in the two film; and the 2D peaks have obvious differences, the 2D peak of the film with high content of AB structure has high asymmetry.

Figure 3:
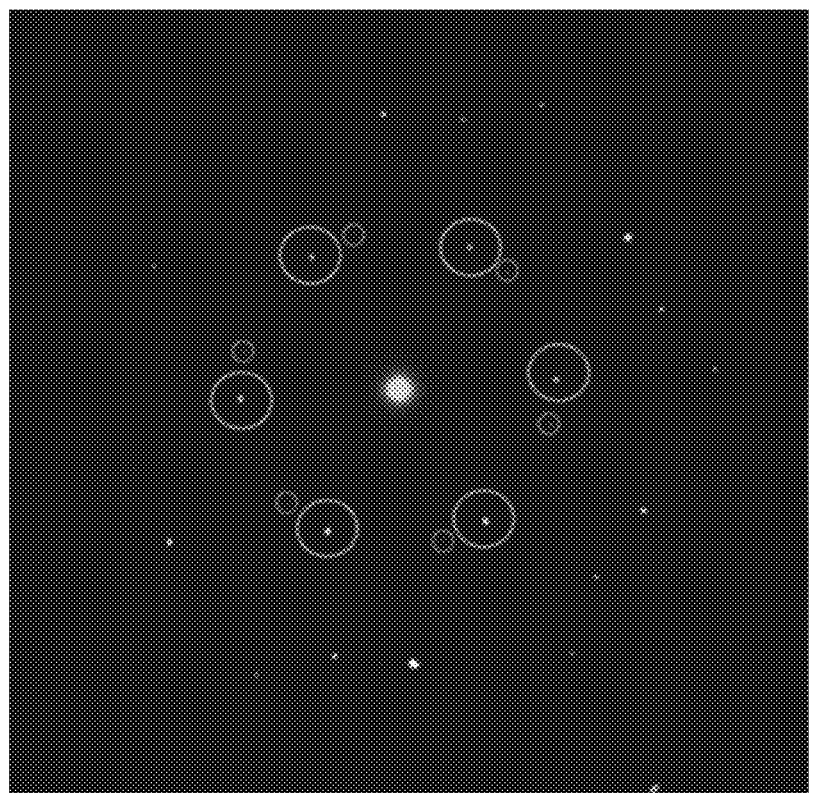
FIG. 3 is an TEM image of two graphene films prepared in Example 1.

The test results by TEM are in complete agreement with the test results by Raman spectroscopy. FIG. 3 shows an electron diffraction pattern of the graphene film with AB structure. This graphene film is stacked with only two structural units, and the spot brightness of one structural unit is significantly higher than that of the second structural unit.

Figure 4:
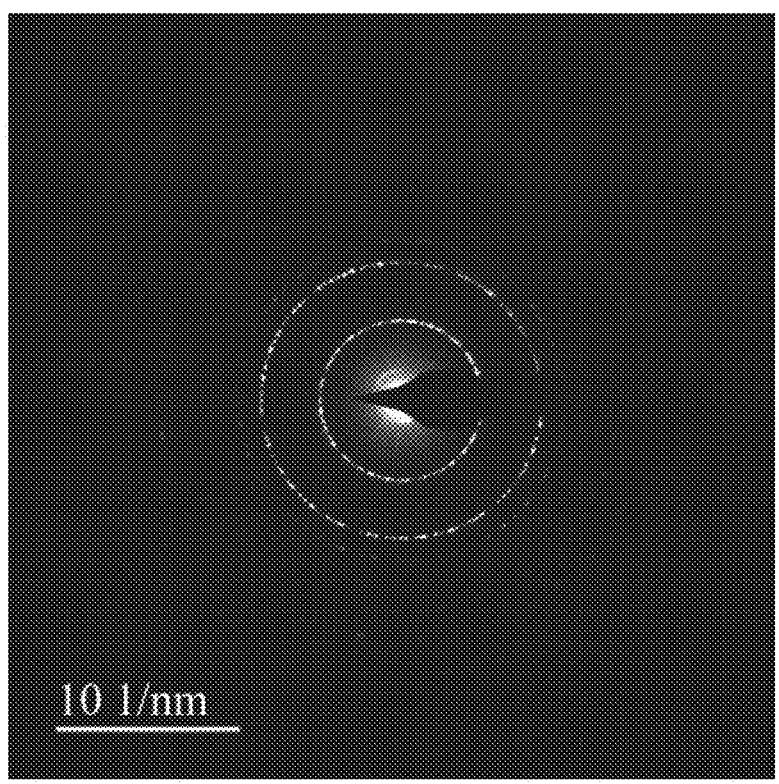
FIG. 4 is an electron diffraction pattern of two graphene films prepared in Example 1.

That is to say, one of the two structural units is extremely thick, and the other one has very few atomic layers, and the two are stacked on each other in non-AB form. The graphene film of non-AB structure has more sets of diffraction spots (FIG. 4), which even forms an amorphous diffraction ring, indicating that this film consists of a large number of structural units stacked on top of each other in non-AB form.

Figure 5:
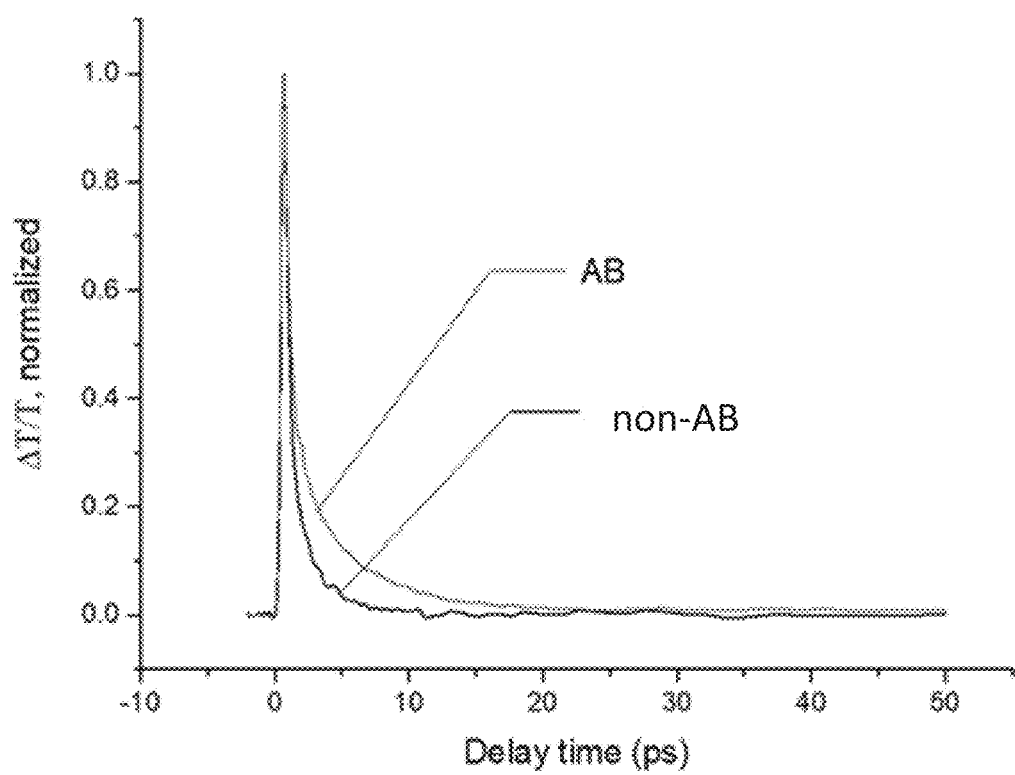
FIG. 5 shows the relaxation time of hot electrons of two graphene films prepared in Example 1.

Based on the above structure, the relaxation time of hot electrons of the two film is tested in the present application. As shown in FIG. 5, with the same excitation time of 200 fs, the relaxation time of hot electrons of the graphene film with AB structure reaches 25 ps, and the relaxation time of hot electrons of the graphene film with non-AB structure is maintained within 10 ps. It can be seen that the graphene units are weakly coupled, and their structure much resembles single-sheet graphene units, which increases the joint density of states and thus increases the number of hot electrons in high-energy states.

The two graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread on the working window and in contact with the electrode layer. Ethylene glycol was dripped to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V (where the silicon terminal was grounded) was applied between the electrode and the semiconductor of the device by a Keithley source meter, and then the device was connected to an amplifier circuit and then to an oscilloscope. The test data obtained is shown in Table 1.

apparatus includes a cylindrical cavity 3 containing a hydroiodic acid solution 2, a PTFE net rack 2 fixed above the liquid surface of the hydroiodic acid solution, a top cover 4 for sealing the cylindrical cavity, and a water-absorbing filter paper 5 provided on the top cover.

A lower part of the cylindrical cavity was located in a water bath 1 at 80° C., and a sample to be peeled was placed on the PTFE net rack 2.

The hydroiodic acid solution was evaporated by heating into HI vapor and steam. The steam was condensed on the top and absorbed by the water-absorbing filter paper, so the steam content in the cavity was reduced. Whereas, the condensation temperature of HI was lower, and it remained gaseous.

In this embodiment, the cylindrical cavity 3 has a volume of 1 L and a bottom area of 120 cm$^2$. The mass concentration of the hydroiodic acid solution in the cavity 3 was 50%, the weight content of HI was 0.42 g, and the rest was water (0.42 g). The water absorption limit of the water-absorbing filter paper (2 g) was 60% of its weight. The ambient temperature of the upper part of the cavity 3 was 0° C.

After heating for 5 min, the hydroiodic acid solution 2 was completely evaporated, and the contained hydrogen iodide solution became invisible to the naked eyes. On the top layer, some condensed water droplets were observed, and the water-absorbing filter paper expanded after moisture absorption. The water-absorbing filter paper was sampled and tested to gain 0.44 g in weight. At this time, the gas was sampled and tested for the acidity, and the concentration of hydroiodic acid was found to remain at 0.33 g/L. It was proved that the steam content in the cavity 3 is below 0.07 g/L. After 1 h, the gas was sampled and tested for the acidity again, and the concentration of hydroiodic acid was found to still remain at 0.32 g/L.

In order to avoid the influence of the above-mentioned sampling and test on the graphene film, a same device was additionally provided in this example, where no water-absorbing filter paper (2 g) and gas in the cavity were sampled, and a same graphene oxide film was directly peeled off. The treatment time was 4 hrs, and the graphene was peeled off after 4 hrs, as shown in FIGS. 10B1 and B2. It can be seen from the figure that by the reduction with

TABLE 1

| Test Item | Graphene film of non-AB structure | Graphene film of AB structure |
|---|---|---|
| Irradiate the graphene layer with infrared light having a wavelength of 1 μm and a power of 5 mW | A 600 μA photocurrent signal is measured within 20 ns | A 98 μA photocurrent signal is measured within 20 ns |
| Irradiate the graphene layer with infrared light having a wavelength of 4 μm and a power of 20 mW | A 35 μA photocurrent signal is measured within 25 ns | A 4 μA photocurrent signal is measured within 25 ns |
| Irradiate the graphene layer with infrared light having a wavelength of 10.6 μm and a power of 50 mW | A 2.5 μA photocurrent signal is measured within 80 ns | A 1.1 μA photocurrent signal is measured within 80 ns |

Example 2

Step 1: The graphene oxide obtained by the hummer method was prepared into a graphene oxide aqueous solution with a concentration of 0.5 μg/mL. Then the graphene oxide aqueous solution was suction filtered to form a graphene oxide film having a thickness of 100 nm and an area of 80±5 cm$^2$ on a rigid tetrafluoroethylene filter membrane with a porosity of 60% as a substrate.

Figure 11A:
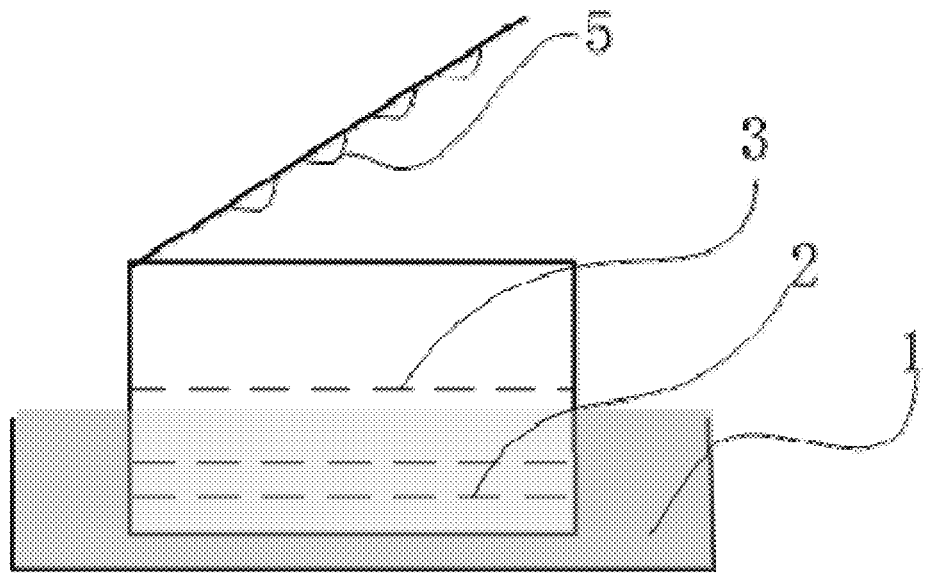
FIG. 11A shows a schematic plan view of a separation apparatus in Example 2.
Figure 11B:
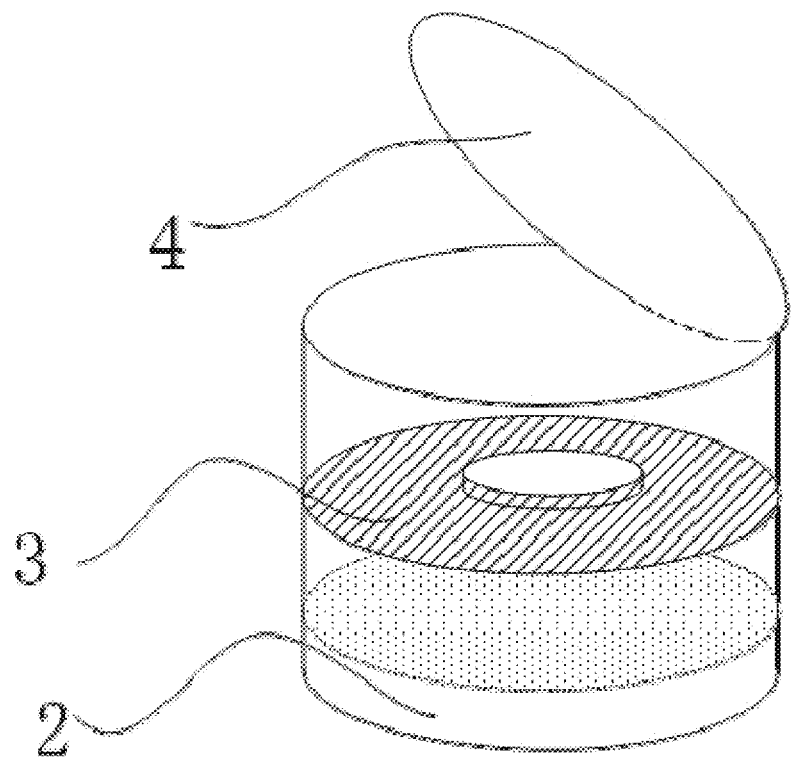
FIG. 11B shows a schematic perspective view B of a separation apparatus in Example 2.

In this example, an apparatus as shown in FIGS. 11A and B was used to peel off the graphene oxide film. The hydroiodic acid, the graphene film is completely separated from the substrate under stress, and there is no occurrence of macroscopic damage or microscopic holes in the separation process.

3 graphene films were prepared following the method in Step 1.

Step 2: The three sample films were respectively annealed in a graphitization furnace at 1600° C., 1800° C., and 2000° C. for 2 hrs.

The films were tested by Raman spectroscopy. The $I_D/I_G$ and non-AB structure content are shown in Table 2.

Figure 6:
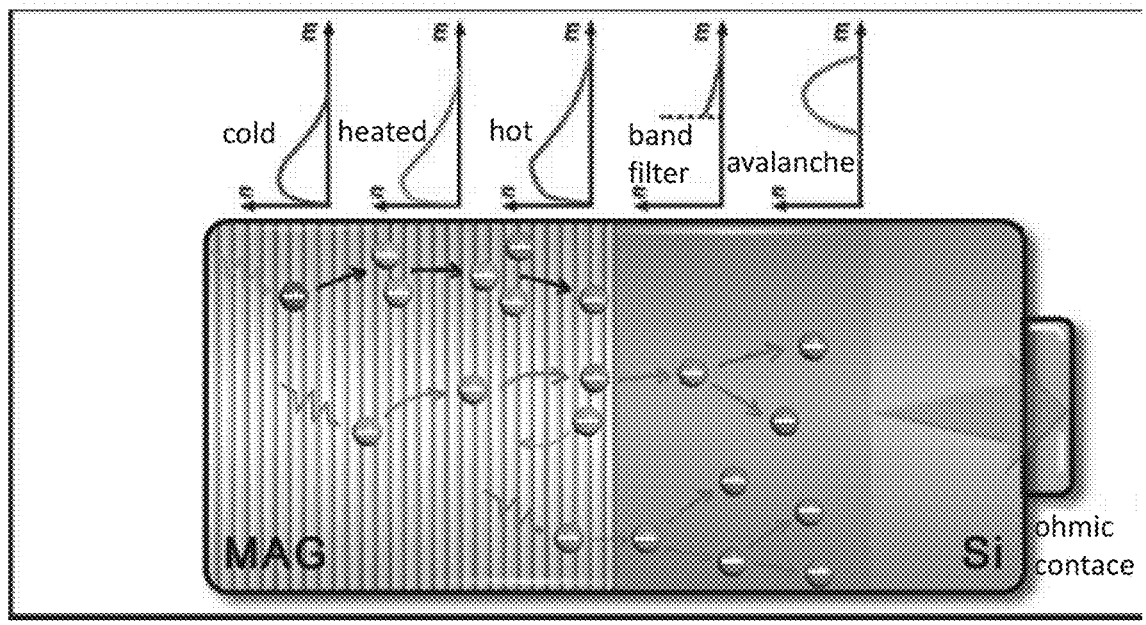
FIG. 6 shows an electron diffraction pattern and corresponding electron lifetime after treatments at different temperature.
Figure 7:
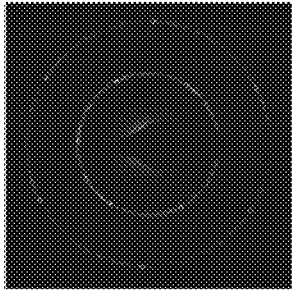
FIG. 7 shows the principle underlying the superposition of light absorption of a multilayer graphene by weak coupling.
Figure 8:
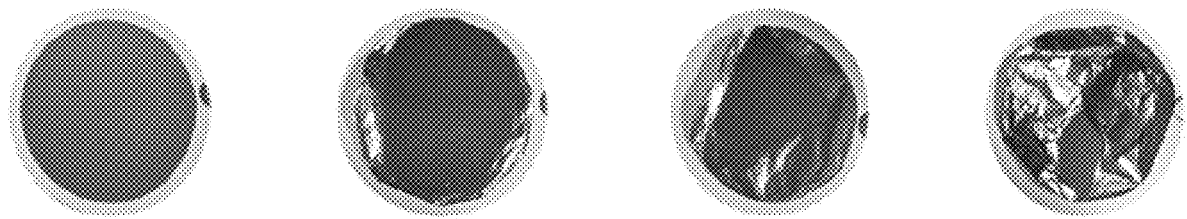
FIG. 8 shows a gradual separation process of a graphene film from a substrate.
Figure 9:
FIG. 9 shows a graphene oxide film (4 inches) obtained by suction filtration on a rigid anodic aluminum oxide filter membrane.

As shown in A1-A3 in FIG. 6, the test of vertically stacked structure by TEM and electron diffraction and the same analysis as in Example 1 confirm that the three graphene films contain a large number of weakly coupled graphene structures including a plurality of graphene units stacked vertically, where the graphene unit is formed by irregularly stacking single-sheet graphene and two vertically adjacent graphene units are weakly coupled.

With an excitation time of 200 fs, the relaxation times of hot electrons of the graphene film are shown in B1-B3 in FIG. 6, and they are all not less than 5 ps.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V (where the silicon terminal was grounded) was applied between the electrode and the semiconductor of the device by a Keithley source meter, and then the device was connected to an amplifier circuit and then to an oscilloscope. The test data obtained is shown in Table 2.

film having a thickness of 60 nm and an area of 80±5 cm$^2$ on a rigid anodic aluminum oxide filter membrane with a porosity of 80% as a substrate.

Figure 12:
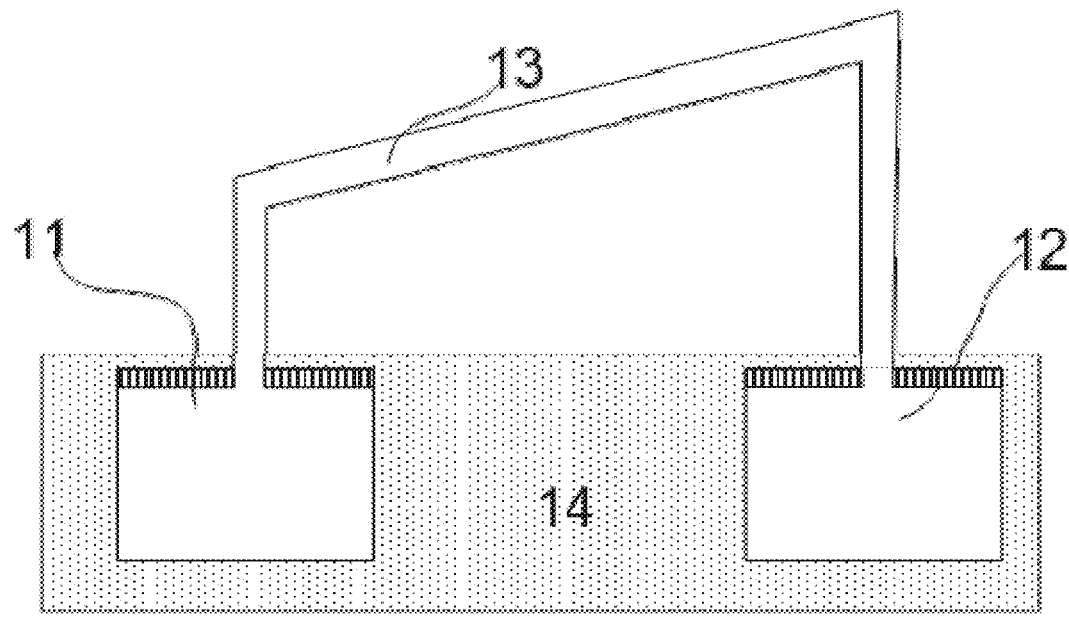
FIG. 12 shows a view of a separation apparatus in Example 3.

In this example, the device as shown in FIG. 12 was used to peel off the graphene oxide film. The device includes a left cavity 11 and a right cavity 12. The cavities 11 and 12 communicate with each other through an inclined condenser tube 13. Both cavities 11 and 12 were placed in a water bath 14 at 80° C.

The cavity 11 contained a hydroiodic acid solution, and the cavity 12 was used to hold the graphene oxide film to be stripped. The hydroiodic acid solution in the cavity 11 was volatilized. The steam therein was condensed in the condenser tube and returned to the cavity 11. The condensation temperature of HI was relatively high, and it was fed to the cavity 12 through the condenser tube 13, to create an environment of high HI concentration and low steam concentration in the cavity 12.

In this example, the volume of the cavities 11 and 12 is 400 mL, and the bottom area is 50 cm$^2$. The content of the hydroiodic acid solution in the cavity 11 was 0.5 g (the mass concentration of HI was 55%). The ambient temperature of the condenser tube 13 was 40° C., the length of the condenser tube was 20 cm, and the inclination angle was 30 degrees. These can effectively ensure the creation of an environment of high HI concentration and low steam concentration in the cavity 12.

Experiments have proved that after heating for 5 min, the hydroiodic acid solution was completely evaporated, and the steam was condensed and returned to the cavity 11 in a front part of the condenser tube. No condensed water was produced in a rear part of the condenser tube, indicating that almost no steam enters the reduction room at the right side.

TABLE 2

| Test Item | Graphitization furnace annealing at 1600° C. | Graphitization furnace annealing at 1800° C. | Graphitization furnace annealing at 2000° C. |
| --- | --- | --- | --- |
| $I_D/I_G$ | 0.23 | 0.08 | 0.005 |
| Non-AB structure content | ≈100% | ≈100% | ≈100% |
| Number of graphene structural units in the vertical direction | ≈200 | ≈200 | ≈200 |
| Number of graphene sheets in the structural unit | ≈1 | ≈1 | ≈1 |
| Irradiate the graphene layer with infrared light having a wavelength of 1 μm and a power of 5 mW | A 1.54 mA photocurrent signal is measured within 52 ns | A 1.58 mA photocurrent signal is measured within 31 ns | A 1.6 mA photocurrent signal is measured within 20 ns |
| Irradiate the graphene layer with infrared light having a wavelength of 4 μm and a power of 20 mW | A 155 μA photocurrent signal is measured within 18 ns | A 161 μA photocurrent signal is measured within 18 ns | A 164 mA photocurrent signal is measured within 18 ns |
| Irradiate the graphene layer with infrared light having a wavelength of 10.6 μm and a power of 50 mW | A 10.7 μA photocurrent signal is measured within 20 ns | A 11.2 μA photocurrent signal is measured within 20 ns | A 12 μA photocurrent signal is measured within 20 ns |

Example 3

(1) The graphene oxide obtained by the hummer method was prepared into a graphene oxide aqueous solution with a concentration of 0.5 μg/mL. Then the graphene oxide aqueous solution was suction filtered to form a graphene oxide The gas in the reduction chamber was sampled and tested for the acidity, and the concentration of hydroiodic acid was found to still remain at 0.43 g/L.

After 30 min, evaporation-condensation reflux was kept in the evaporation chamber, and there was still no condensed water in the rear part of the condenser tube. The gas in the reduction chamber was sampled and tested for the acidity, and the concentration of hydroiodic acid was found to still remain at 0.41 g/L.

In order to avoid the influence of the above-mentioned sampling and test on the graphene film, a same device was additionally provided in this example, where no gas in the cavity was sampled, and a same graphene oxide film was directly peeled off. After 1 hr of reduction, the graphene film was peeled off, as shown in FIGS. 10C1 and C2. It can be seen from the figure that by the reduction with hydroiodic acid, the graphene film is completely separated from the substrate under stress, and there is no occurrence of macroscopic damage or microscopic holes in the separation process.

(2) The film was annealed for 0.5 hr in a graphitization furnace at 2000° C.

The film was tested by Raman spectroscopy. $I_D/I_G$ is 0.05, the content of non-AB structure is ≈100%, the number of graphene structural units in the vertical direction is 60, and the number of graphene sheet in a single graphene structural unit is 1.

The test of vertically stacked structure by TEM and electron diffraction confirms that the graphene film contains a large number of weakly coupled graphene structures including a plurality of graphene units stacked vertically, where the graphene unit is formed by irregularly stacking single-sheet graphene, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 1.1 mA was measured within 20 ns.

The graphene layer was irradiated with infrared light having a wavelength of 4 μm and a power of 20 mW, and a photocurrent signal of 97 μA was measured within 25 ns.

The graphene layer was irradiated with infrared light having a wavelength of 10.6 μm and a power of 50 mW, and a photocurrent signal of 8.3 μA was measured within 80 ns.

Example 4

(1) The graphene oxide obtained by the hummer method was prepared into a graphene oxide aqueous solution with a concentration of 0.5 μg/mL. Then the graphene oxide aqueous solution was suction filtered to form a graphene oxide film having a thickness of 60 nm and an area of 80±5 cm² on a rigid anodic aluminum oxide filter membrane with a porosity of 80% as a substrate.

Figure 13:
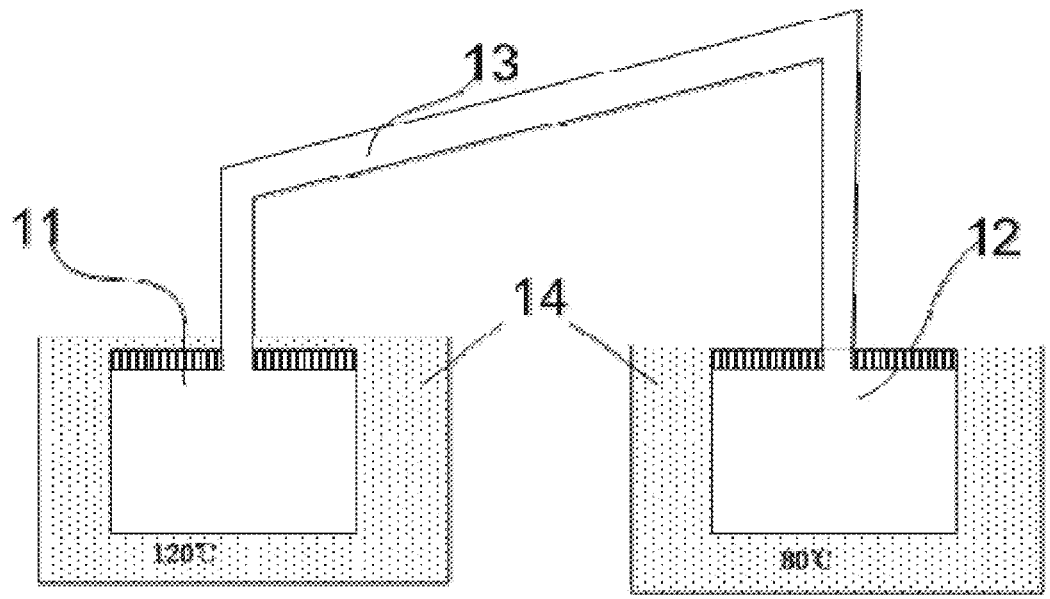
FIG. 13 shows a view of a separation apparatus in Example 4.

In this example, the device as shown in FIG. 13 was used to peel off the graphene oxide film. The device includes a left cavity 11 and a right cavity 12. The cavities 11 and 12 communicate with each other through an inclined condenser tube 13. The cavity 11 was placed in an oil bath 14 at 120° C., and the cavity 12 was placed in a water bath 14 at 80° C.

The cavity 11 contained a hydroiodic acid solution, and the cavity 12 was used to hold the graphene oxide film to be stripped. The hydroiodic acid solution in the cavity 11 was volatilized. The steam therein was condensed in the condenser tube and returned to the cavity 11. The condensation temperature of HI was relatively high, and it was fed to the cavity 12 through the condenser tube 13, to create an environment in the cavity 12 with high HI concentration and low steam concentration.

As described in Example 2, in this example, the volume of the cavities 11 and 12 is 400 mL, and the bottom area is 50 cm². The content of the hydroiodic acid solution in the cavity 11 was 0.3 g (the mass concentration of HI was 55%). The ambient temperature of the condenser tube 13 was 20° C., the length of the condenser tube was 20 cm, and the inclination angle was 30 degrees. These can effectively ensure the creation of an environment of high HI concentration and low steam concentration in the cavity 12.

Experiments have proved that after heating for 5 min, the hydroiodic acid solution was completely evaporated, and the steam was condensed and returned to the cavity 11 in a front part of the condenser tube. No condensed water was produced in a rear part of the condenser tube, indicating that almost no steam enters the reduction room at the right side. The gas in the reduction chamber was sampled and tested for the acidity, and the concentration of hydroiodic acid was found to still remain at 0.33 g/L.

After 10 min, evaporation-condensation reflux was kept in the evaporation chamber, and there was still no condensed water in the rear part of the condenser tube. The gas in the reduction chamber was sampled and tested for the acidity, and the concentration of hydroiodic acid was found to still remain at 0.30 g/L.

In order to avoid the influence of the above-mentioned sampling and test on the graphene film, a same device was additionally provided in this example, where no gas in the cavity was sampled, and a same graphene oxide film was directly peeled off. After 2 hrs of reduction, the graphene film was peeled off, as shown in FIGS. 10D1 and D2. It can be seen from the figure that by the reduction with hydroiodic acid, the graphene film is completely separated from the substrate under stress, and there is no occurrence of macroscopic damage or microscopic holes in the separation process.

(2) The film was annealed for 12 hrs in a graphitization furnace at 2000° C.

The film was tested by Raman spectroscopy. $I_D/I_G$ is 0.003, the content of non-AB structure is ≈100%, the number of graphene structural units in the vertical direction is 60, and the number of graphene sheet in a single graphene structural unit is 1.

The test of vertically stacked structure by TEM and electron diffraction confirms that the graphene film contains a large number of weakly coupled graphene structures including a plurality of graphene units stacked vertically, where the graphene unit is formed by irregularly stacking single-sheet graphene, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 1.13 mA was measured within 20 ns.

The graphene layer was irradiated with infrared light having a wavelength of 4 μm and a power of 20 mW, and a photocurrent signal of 99 μA was measured within 25 ns.

The graphene layer was irradiated with infrared light having a wavelength of 10.6 μm and a power of 50 mW, and a photocurrent signal of 8.1 μA was measured within 80 ns.

Example 5

(1) The graphene oxide obtained by the hummer method was prepared into a graphene oxide aqueous solution with a concentration of 0.5 μg/mL. Then the graphene oxide aqueous solution was suction filtered to form a graphene oxide film on anodic aluminum oxide as a substrate, where the number of atomic layers of graphene oxide is 120.

In this example, an existing solid-phase transfer agent was used to finely transfer a graphene oxide film deposited on anodic aluminum oxide and an intact independent self-supporting film was obtained after many attempts.

(2) The film was annealed for 4 hrs in a graphitization furnace at 2300° C.

The film was tested by Raman spectroscopy. $I_D/I_G$ is ≈0 (below the detection limit of Raman spectroscopy), the content of AB structure is 50%, the number of graphene structural units in the vertical direction is 60, and the number of graphene sheet in a single graphene structural unit is 2.

The test of vertically stacked structure by TEM and electron diffraction confirms that the graphene film contains a large number of weakly coupled graphene structures including a plurality of graphene units stacked vertically, where the graphene unit is formed by irregularly stacking single-sheet graphene, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 1.3 mA was measured within 20 ns.

The graphene layer was irradiated with infrared light having a wavelength of 4 μm and a power of 20 mW, and a photocurrent signal of 122 mA was measured within 25 ns.

The graphene layer was irradiated with infrared light having a wavelength of 10.6 μm and a power of 50 mW, and a photocurrent signal of 10 μA was measured within 80 ns.

Example 6

(1) The graphene oxide obtained by the hummer method was prepared into a graphene oxide aqueous solution with a concentration of 0.5 μg/mL. Then the graphene oxide aqueous solution was suction filtered to form a graphene oxide film on anodic aluminum oxide as a substrate, where the number of atomic layers of graphene oxide is 120.

In this example, an existing solid-phase transfer agent was used to finely transfer a graphene oxide film deposited on anodic aluminum oxide and an intact independent self-supporting film was obtained after many attempts.

(2) The film was annealed for 2 hrs in a graphitization furnace at 2800° C.

The film was tested by Raman spectroscopy. $I_D/I_G$ is ≈0, the content of AB structure is 90%, the number of graphene structural units in the vertical direction is 13, and the number of graphene sheet in a single graphene structural unit is 9.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 1.1 mA was measured within 20 ns.

The graphene layer was irradiated with infrared light having a wavelength of 4 μm and a power of 20 mW, and a photocurrent signal of 113 μA was measured within 25 ns.

The graphene layer was irradiated with infrared light having a wavelength of 10.6 μm and a power of 50 mW, and a photocurrent signal of 9 μA was measured within 80 ns.

Example 7

(1) A single-layer graphene on copper prepared by CVD was removed from the substrate by the hydrogen evolution method, and stacked layer by layer until the number of atomic layers of graphene is 150.

(2) The film was annealed for 12 hrs in a graphitization furnace at 2000° C.

The film was tested by Raman spectroscopy. $I_D/I_G$ is 0.003, the content of non-AB structure is ≈100%, the number of graphene structural units in the vertical direction is 150, and the number of graphene sheet in a single graphene structural unit is 1.

The test of vertically stacked structure by TEM and electron diffraction confirms that the graphene film contains a large number of weakly coupled graphene structures including a plurality of graphene units stacked vertically, where the graphene unit is formed by irregularly stacking single-sheet graphene, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 4 mA was measured within 20 ns.

The graphene layer was irradiated with infrared light having a wavelength of 4 μm and a power of 20 mW, and a photocurrent signal of 160 μA was measured within 25 ns.

The graphene layer was irradiated with infrared light having a wavelength of 10.6 μm and a power of 50 mW, and a photocurrent signal of 15 μA was measured within 80 ns.

Example 8

(1) A single-layer graphene on copper prepared by CVD was removed from the substrate by the hydrogen evolution method, and stacked layer by layer until the number of atomic layers of graphene is 150.

(2) The film was annealed for 2 hrs in a graphitization furnace at 2800° C.

The film was tested by Raman spectroscopy. $I_D/I_G$ is ≈0, the content of AB structure is ≈50%, the number of graphene structural units in the vertical direction is 75, and the number of graphene sheet in a single graphene structural unit is 2.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 3.3 mA was measured within 20 ns.

The graphene layer with infrared light having a wavelength of 4 μm and a power of 20 mW, and a photocurrent signal of 130 μA was measured within 18 ns.

The graphene layer with infrared light having a wavelength of 10.6 μm and a power of 50 mW, and a photocurrent signal of 14 μA was measured within 20 ns.

Example 9

(1) A multi-layer graphene on nickel prepared by CVD was removed from the substrate by etching with hydrochloric acid and hydrogen peroxide and stacked layer by layer until the number of atomic layers of graphene is 180.

(2) The film was annealed for 12 hrs in a graphitization furnace at 2000° C.

The film was tested by Raman spectroscopy. $I_D/I_G$ is 0.003, the content of non-AB structure is 50%, the number of graphene structural units in the vertical direction is 90, and the number of graphene sheet in a single graphene structural unit is 2.

The test of vertically stacked structure by TEM and electron diffraction confirms that the graphene film contains a large number of weakly coupled graphene structures including a plurality of graphene units stacked vertically, where the graphene unit is formed by irregularly stacking single-sheet graphene, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 µm and a power of 5 mW, and a photocurrent signal of 5.0 mA was measured within 20 ns.

The graphene layer was irradiated with infrared light having a wavelength of 4 µm and a power of 20 mW, and a photocurrent signal of 190 µA was measured within 25 ns.

The graphene layer was irradiated with infrared light having a wavelength of 10.6 µm and a power of 50 mW, and a photocurrent signal of 17 µA was measured within 80 ns.

Example 10

(1) A multi-layer graphene on nickel prepared by CVD was removed from the substrate by etching with hydrochloric acid and hydrogen peroxide and stacked layer by layer until the number of atomic layers of graphene is 180.

(2) The film was annealed for 2 hrs in a graphitization furnace at 2800° C.

The film was tested by Raman spectroscopy. $I_D/I_G$ is ≈0, the content of AB structure is 89%, the number of graphene structural units in the vertical direction is 60, and the number of graphene sheet in a single graphene structural unit is 3.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 µm and a power of 5 mW, and a photocurrent signal of 4.1 mA was measured within 20 ns.

The graphene layer was irradiated with infrared light having a wavelength of 4 µm and a power of 20 mW, and a photocurrent signal of 120 µA was measured within 25 ns.

The graphene layer was irradiated with infrared light having a wavelength of 10.6 µm and a power of 50 mW, and a photocurrent signal of 11 µA was measured within 80 ns.

Example 11

(1) A multi-layer graphene on nickel prepared by CVD was removed from the substrate by etching with hydrochloric acid and hydrogen peroxide and stacked alternately layer-by-layer with a single-layer graphene prepared on a copper substrate, until the number of atomic layers of graphene is 180.

(2) The film was annealed for 2 hrs in a graphitization furnace at 2800° C.

The film was tested by Raman spectroscopy. $I_D/I_G$ is ≈0, the content of AB structure is 75%, the number of graphene structural units in the vertical direction is 60, and the number of graphene sheet in a single graphene structural unit is 3.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 4.4 mA was measured within 20 ns.

The graphene layer was irradiated with infrared light having a wavelength of 4 μm and a power of 20 mW, and a photocurrent signal of 130 μA was measured within 25 ns.

The graphene layer was irradiated with infrared light having a wavelength of 10.6 μm and a power of 50 mW, and a photocurrent signal of 14 μA was measured within 80 ns.

Example 12

(1) A polyimide solution was spin-coated on a multilayer graphene on nickel prepared by CVD, and a polyimide/graphene composite film with a total thickness of 100 nm was obtained. The substrate was removed by etching with hydrochloric acid and hydrogen peroxide.

(2) The film was annealed for 2 hrs in a graphitization furnace at 2800° C.

The film was tested by Raman spectroscopy. $I_D/I_G$ is ≈0, the content of AB structure is 90%, the number of graphene structural units in the vertical direction is 14, and the number of graphene sheet in a single graphene structural unit is 9.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data obtained is shown.

The graphene layer was irradiated with infrared light having a wavelength of 1 μm and a power of 5 mW, and a photocurrent signal of 0.91 mA was measured within 20 ns.

The graphene layer was irradiated with infrared light having a wavelength of 4 μm and a power of 20 mW, and a photocurrent signal of 97 μA was measured within 25 ns.

The graphene layer was irradiated with infrared light having a wavelength of 10.6 μm and a power of 50 mW, and a photocurrent signal of 7.3 μA was measured within 80 ns.

Example 13

(1) Polyacrylonitrile with a thickness of 100 nm was spin coated on a single-layer graphene on copper prepared by CVD, and then the substrate was removed by the hydrogen evolution method.

(2) The film was annealed for 12 hrs in a graphitization furnace at 2300° C.

The film was tested by Raman spectroscopy. $I_D/I_G$ is 0.04, the content of non-AB structure is 50%, the number of graphene structural units in the vertical direction is 60, and the number of graphene sheet in a single graphene structural unit is 2.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form, and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data was obtained.

The graphene layer was irradiated with infrared light having a wavelength of 1 μm and a power of 5 mW, and a photocurrent signal of 1.21 mA was measured within 20 ns.

The graphene layer was irradiated with infrared light having a wavelength of 4 μm and a power of 20 mW, and a photocurrent signal of 35 μA was measured within 25 ns.

The graphene layer was irradiated with infrared light having a wavelength of 10.6 μm and a power of 50 mW, and a photocurrent signal of 9.2 μA was measured within 80 ns.

Example 14

(1) A single-layer graphene was formed on the surface of anodic aluminum oxide by suction filtration, and then a mixture of pitch and graphene oxide (at a weight ratio of 1:1) with a thickness of 200 nm was formed by suction filtration. The substrate was removed by camphor transfer.

(2) The film was annealed for 2 hrs in a graphitization furnace at 2800° C.

The film was tested by Raman spectroscopy. $I_D/I_G$ is ≈0, the content of AB structure is 95%, the number of graphene structural units in the vertical direction is 8, and the number of graphene sheet in a single graphene structural unit is 19.

The test of vertically stacked structure by TEM and electron diffraction confirms that the graphene film contains a large number of strongly coupled graphene structures including a small number of graphene units stacked vertically, where the graphene unit is formed by stacking single-sheet graphene in AB form and two vertically adjacent graphene units are weakly coupled.

The graphene films prepared above were used to fabricate a photoelectric device according to the following steps:

(1) A working window was reserved on a Si substrate, an insulating layer was coated in other areas than the working window, and then a Pt electrode layer was sputtered in the insulating layer.

(2) The graphene film was spread flatly on the working window and in contact with the electrode layer. Ethylene glycol was added dropwise to the edge of the graphene film to allow ethylene glycol to penetrate from the edge of the graphene film to the inside. The solvent was volatilized, and the film was tightly bound to the semiconductor by virtue of the surface tension of the solvent, to obtain an independent photoelectric device.

(3) The photoelectric device was encapsulated, and a lead wire is respectively connected to the electrode layer and the semiconductor substrate of the photoelectric device for outputting detection signals.

A reverse bias voltage of −2V to −1V was applied between the electrode and the semiconductor of the device by a Keithley source meter, and then the device was connected to an amplifier circuit and then to an oscilloscope. The test data was obtained.

The graphene layer was irradiated with infrared light having a wavelength of 1 μm and a power of 5 mW, and a photocurrent signal of 3.1 mA was measured within 20 ns.

The graphene layer was irradiated with infrared light having a wavelength of 4 μm and a power of 20 mW, and a photocurrent signal of 112 μA was measured within 25 ns.

The graphene layer was irradiated with infrared light having a wavelength of 10.6 μm and a power of 50 mW, and a photocurrent signal of 12.5 μA was measured within 80 ns.

What is claimed is:

1. A graphene photoelectric device, comprising a graphene film and a semiconductor substrate, wherein the graphene film is spread on the semiconductor substrate; and
    wherein the graphene film comprises a graphene structure comprising a plurality of graphene units stacked vertically; each graphene unit consists of two or more graphene sheets stacked in AB form; electron cloud between two vertically adjacent graphene units achieves an incomplete coupling effect, to promote hot electron transition and increase joint density of states, thereby increasing number of hot electrons in high-energy states; stacking direction of the graphene units in the graphene structure is in thickness direction of the graphene film; and the graphene film enhances accumulation of hot electrons in high-energy states by the graphene structure.

2. A method for preparing a graphene photoelectric device according to claim 1, comprising: spreading the graphene film on the semiconductor substrate by placing the graphene film on the semiconductor substrate, and dripping a solvent of high surface tension on an edge of the graphene film, so that the solvent spreads out wrinkles of the graphene film when the solvent penetrates from the edge of the graphene film to an interior; and volatilizing the solvent.

3. The method for preparing a graphene photoelectric device according to claim 2, wherein the solvent of high surface tension comprises one or more of the following: deionized water, dmf, dmac, ethylene glycol, propylene glycol, o-xylene, toluene, butyl acetate, liquid paraffin, Menthol and a mixture thereof.

4. The method for preparing a graphene photoelectric device according to claim 1, wherein further comprising sintering the graphene film-at a sintering temperature of 400 to 1000 degrees Celsius after the solvent is volatilized.

5. The graphene photoelectric device according to claim 1, wherein the semiconductor substrate comprises: an elemental semiconductor or a compound semiconductor, including one or more of the following: Si, Ge, diamond, Sn, InP, GaAs, AlGaAs, InGaP, InGaAs, AlInGaP, AlInGaAs, InGaAsP, AlInGaAsP, GaN, InGaN, AlGaN, AlInGaN, GaP, alloys and derivatives thereof.

6. The graphene photoelectric device according to claim 1, wherein the graphene film has an Ip/IG ratio of 0.05 or less.

7. The graphene photoelectric device according to claim 1, wherein the graphene film has a non-AB structure content of 5% or more.

8. The graphene photoelectric device according to claim 1, wherein the graphene film has a non-AB structure content of more than 90%.

9. The graphene photoelectric device according to claim 1, wherein the graphene unit consists of 2 to 9 graphene sheets.

10. A method for preparing a graphene photoelectric device according to claim 1, comprising the following steps:
    (1) reserving a working window on a semiconductor substrate, coating an insulating layer in other areas than the working window, and then sputtering an electrode layer in the insulating layer;
    (2) spreading multiple layers of graphene films on the working window and in contact with the electrode layer, dripping an organic solvent to an edge of the graphene film to allow the organic solvent to penetrate from the edge of the graphene film to an interior, volatilizing the solvent, and tightly binding the graphene film to the semiconductor by virtue of surface tension of the solvent, to obtain an independent photoelectric device; and
    (3) encapsulating the photoelectric device, and connecting a lead wire respectively to the electrode layer and the semiconductor substrate of the photoelectric device for outputting detection signals.

* * * * *